US007838950B2

United States Patent
Detlev

(10) Patent No.: US 7,838,950 B2
(45) Date of Patent: Nov. 23, 2010

(54) ELECTRO-MECHANICAL COMPONENT, SUCH AS A STRAINED SI FIN-FET

(75) Inventor: Gruetzmacher Detlev, Lauchringen (DE)

(73) Assignee: Paul Scherer Institut, Villigen PSI (CH)

( * ) Notice: Subject to any disclaimer, the term of this patent is extended or adjusted under 35 U.S.C. 154(b) by 770 days.

(21) Appl. No.: 11/236,884

(22) PCT Filed: Jan. 31, 2004

(86) PCT No.: PCT/EP2004/000867

§ 371 (c)(1),
(2), (4) Date: Mar. 4, 2008

(87) PCT Pub. No.: WO2004/089811

PCT Pub. Date: Oct. 21, 2004

(65) Prior Publication Data

US 2008/0191242 A1    Aug. 14, 2008

(30) Foreign Application Priority Data

Apr. 11, 2003 (EP) ................................. 03008446

(51) Int. Cl.
*H01L 29/04* (2006.01)
(52) U.S. Cl. .............................. 257/414; 257/E27.026
(58) Field of Classification Search ................. 257/414, 257/190, E27.112, E21.703, E29.295, E21.228, 257/E27.07; 438/3, 745, 478
See application file for complete search history.

(56) References Cited

PUBLICATIONS

Golod S Vet Al: "Fabricaiton of Conducting GESI/SI Micro- and Nanotubes~ and Helical Microcoils"Semiconductor Science and Technology, Institute of Physics. London, GB, vol. 16, No. 3, Mar. 2001, pp. 181-185, XP001030220.*
Fabricaiton of Conducting GESI/SI Micro- and Nanotubes and Helical Microcoils Semiconductor Science and Technology, Institute of Physics. London, GB, vol. 16, No. 3, Mar. 2001, pp. 181-185.*
XP001030220 Mar. 3, 2001 Golod S V et al Fabrication of conducting gesi/si micro- and nanotubes and helical microcoils.
XP002331066 Sep. 5, 2002 Schmidt O G et al Self-assembled nanoholes, lateral quantum-dot molecules, and rolled-up nanotubes.
XP001122727 Jun. 6, 2002 Vorob'ev A B et al Directional rolling of strained heterofilms.
XP010596836 Jul. 1, 2002 Vorob'ev A B et al Magnetotransport properties of two-dimensional electron gas on cylindrical surface.
XP012027928 May 7, 2001 Vaccaro Pablo O et al Strain-driven self-positioning of micromachined structures.

* cited by examiner

*Primary Examiner*—Evan Pert
*Assistant Examiner*—Selim Ahmed
(74) *Attorney, Agent, or Firm*—Laurence A. Greenberg; Werner H. Stemer; Ralph E. Locher

(57) ABSTRACT

The present invention is an electro mechanical component, such as a nano-electro-mechanical component, having a first, a second and a third portion arranged such that the second portion is used to functionally connect the first and the third portion. In the present invention, the second portion is a bilayer having a first and a second layer made from two dissimilar at least semiconductive materials; the two materials have different lattice constants; and the first layer harbors tensile strain close to an interface connecting the first and the second layer and harbors compressive strain at its surface; and the second layer harbors compressive strain close to the interface connecting the first and the second layer and tensile strain at the relaxed outer section.

14 Claims, 3 Drawing Sheets

ELECTRO-MECHANICAL COMPONENT, SUCH AS A STRAINED SI FIN-FET

BACKGROUND OF THE INVENTION

The invention relates to an electro-mechanical component, i.e. a nano electro-mechanical component such as a Si-Fin-FET, having a first, a second and a third portion, whereby the second portion is used to functionally connect the first and the third portion. Further, the invention relates to a method for manufacturing an electro-mechanical component having a first, a second and a third section, whereby the second section comprises a first and a second layer.

A fin-FET has a specific type of architecture and comprises a drain and a source electrode connected via a drain to source-channel which is formed as a fin. Part of this fin can be insulated to bear the gate electrode of the FET. Therefore, fin-FET's recently attracted a lot of attention as a possible route for ultra small high speed electronics, since they may provide the potential to reduce dramatically the gate length without suffering from short channel effects.

However, the fabrication relies on the capabilities to carve out a semiconductive fin, such as a Si fin, from a bulk semiconductor wafer, such as Si wafer. For this carve out process either wet chemical or RIE etching techniques are to be used. Unfortunately, these techniques are seriously difficult to control on the desired nanometer level and typically lead to surface roughness, which might alter the device performance quite substantially. It has to be pointed out that even a roughness in the sub-nanometer regime will impact the device fabricated from a fin of only 10 to 30 nm in width with respect to its unique electrical properties, such as capacity of the fin, electron and electron hole concentration.

SUMMARY OF THE INVENTION

It is therefore the aim of the invention to provide an electro-mechanical component and a method for producing an electro-mechanical component which offer high aspect ratios und superior load carrier mobility and which offer a comparably simple process for manufacturing as well.

This aim is achieved with reference to the initially mentioned electro-mechanical component according to the invention by an electro mechanical component, i.e. a nano electro-mechanical component, having a first, a second and a third portion, whereby the second portion is used to functionally connect the first and the third portion, comprising:

a) the second portion comprises a bilayer comprising a first and a second layers made from two dissimilar at least semiconductive materials;

b) the two materials having different lattice constants; and c) the first layer harbours tensile strain close to an interface connecting the first and the second layer and harbours compressive strain at its surface; and d) the second layer harbours compressive strain close to the interface connecting the first and the second layer and tensile strain at the relaxed outer section.

This aim is achieved with reference to the initially mentioned method according to the invention by a method for manufacturing an electro-mechanical component having a first, a second and a third section, whereby the second section comprises a first and a second layer, comprising the steps of:

a) forming an initial block having a plane surface, comprising as seen from the lower to the upper end a substrate layer of an at least partially semiconductive material, a sacrificial layer of an at least semiconductive material disposed on the substrate layer, the second layer of a second at least semiconductive material disposed on the sacrificial layer and first layer of a first at least semiconductive material disposed on the second layer, whereby the a second lattice constant of the second at least semiconductive material is larger than a first lattice constant of the first at least semiconductive material, b) applying a mesa structure to the first layer;

c) underetching the mesa structure in order to detach a bi-layer structure defined by the mesa structure out of the plane of the second layer; said bilayer structure self-forming the second section as curved member due to the mechanical strain caused by the difference of the first and second lattice constants; and d) growing the first and the third section under mutual insulation on dissimilar parts of the bilayer structure.

This method and this electro-mechanical component allow to circumvent the aforementioned problems because of the self-generation of the detached strained bilayers. Due to the fact that the first and second layer can be epitaxially grown on an appropriate substrate layer, such as (100) Si wafer or SOI wafer, the growth of the first and second layer can be controlled down to the atomic range which generates the curved member having sidewalls being perfectly smooth with a roughness only in the atomic range. This yields to the desired aspect ratio, for instance, for the drain to source channel of a fin-Si FET. Additionally, the concept of strain semiconductor material, like Si, contributes significantly to the carrier mobility and thus to the speed of the device. Moreover, the method is provided enabling to fabricate ultra thin fins with extremely high aspect ratios without the use of advanced lithography.

In an preferred embodiment a formation of vertical rings from strained semiconductor heterostructures is proposed. For this specific formation as well as for all other strained semiconductor heterostructures all material combinations will work, which fulfill the following requirements. The strained heterostructure is divided into two sections, section I is in this example considered as the top part and section II is the bottom part respectively. Each section can contain one or more layers of different composition. To allow for scrolling the crucial requirement is that the net average lattice constant in the top part has to be smaller than the net average lattice constant of the bottom part.

In the case of pseudomorphic or only partly relaxed growth of section I and II this strain induced by the lattice mismatch will guarantee the scrolling process. Possible section I/section II material combinations can be found in group IV semiconductor heterostructures, such as i.e. $Si/Si_xGe_{1-x}$, $Si_yC_{1-y}/Si_xGe_{1-x}$. According to group III/V compound semiconductors suitable material combinations comprises combinations such as i.e. $GaAs_yP_{1-y}/Al_xGa_{1-x}As$, $Al_xGa_{1-x}As/Ga_zIn_{1-z}As_yP_{1-y}$, $Ga_xIn_{1-x}As_yP_{1-y}/Ga_xIn_{1-x}As_ySb_{1-y}$, $Ga_xIn_{1-x}As_yN_{1-y}/Al_zGa_{1-z}As$ and related materials. There exist as well as number of suitable group II/VI compound semiconductors, such as i.e. $ZnS_ySe_{1-y}/ZnSe_zTe_{1-z}$, $Cd_xHg_{1-x}S/Cd_yHg_{1-y}Te$ and related materials and IV/VI compound semiconductors, such i.e. $Pb_{1-x}Sn_xS_ySe_{1-y}/Pb_{1-z}Sn_zTe$ $Pb_yMn_{1-y}Se/Pb_{1-x}Mn_xTe$, $Pb_{1-x-y}Sn_xGe_yTe/Pb_{1-z}Ge_zTe$ and related compounds.

The introduction of Ga or In atoms into IV/VI materials as well as of Mn or other doping atoms into III/V compounds or group IV heterostructures is possible as well.

Structures containing more than one layer in section I and II may contain the following structures: SiC/Si/SiGe or GaAs/GaInAsP/GaInAs/InP. These combinations will allow for complex band gap design permitting the confinement of two-dimensional electron and hole gases in the hetero- and quantum well structures.

Other advantageous feature of possible options can be found in dependent claim given below.

BRIEF DESCRIPTION OF THE SEVERAL VIEWS OF THE DRAWINGS

These and the other features of the present invention can be best understood from the following specification and drawings, the following of which is a brief description.

DETAILED DESCRIPTION OF THE INVENTION

Figure 1:
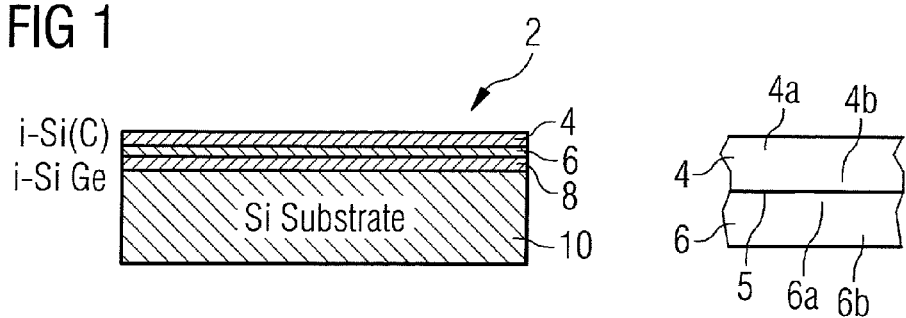
FIG. 1 is a schematical view on the composition of a strained bi-layer.
Figure 2:
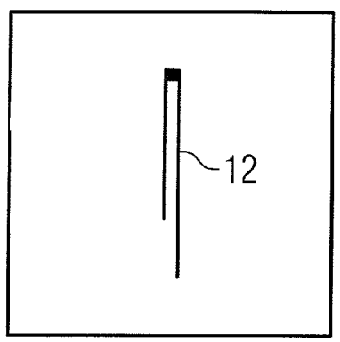
FIG. 2 is a schematical view on a typical mesa structure in order to generate a curved member in form of a ring.

The idea of an electro-mechanical component is schematically shown in the FIGS. 1 to 4. Starting in FIG. 1 from a strained Si/SiGe bilayer 2 having a first upper layer 4 of i-Si(C) and a second lower layer 6 of i-SiGe deposited on a sacrificial layer 8 of n-Si on top of a Si wafer 10 (alternatively a SOI wafer can be used. The different layer 4, 6, 8 are grown epitaxially on the 100 Si wafer and could in this manner controlled on an atomic level with respect to their respective depth. In the second step a mesa structure 12 is defined using standard lithography and etching techniques which is shown as an example of a mask in FIG. 2 used for the definition of the mesa.

Figure 3:
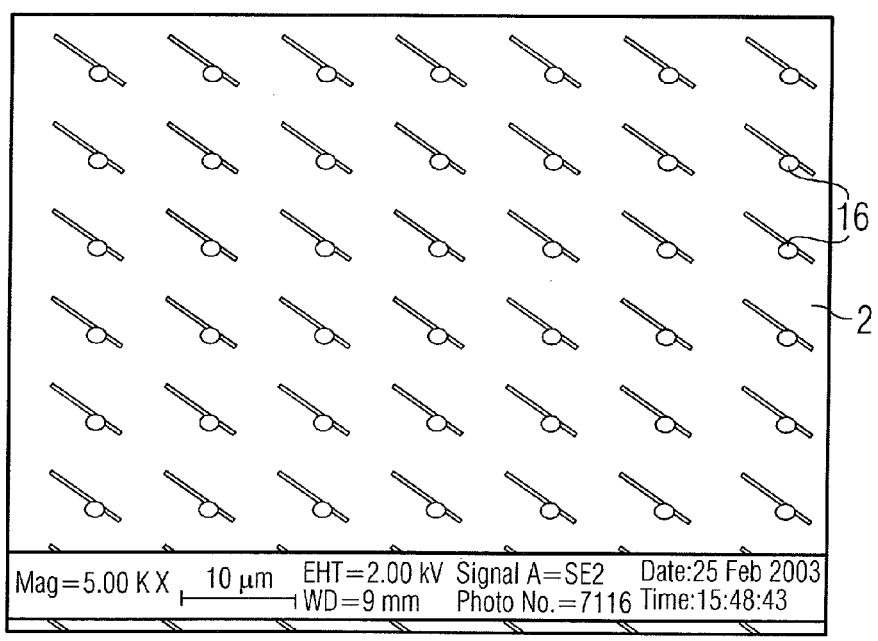
FIG. 3 is a scanning electron microscopy (SEM) analysis of the surface of the strained bi-layer as shown in FIG. 1 after underetching the mesa structure as shown in FIG. 2.

In a third step the mesa structure 12 is selectively underetched and rings 14, 16, 18 are formed which tip over due to the design of the mesa structure 12 and thus form vertical rings 16, 18 sitting on the surface of the bilayer 2 as illustrated in FIG. 3 from an scanning electron microscope image. The rings 14, 16, 18 are formed due to the compressive strain of the second lower SiGe layer 6 in the bilayer 2, which will relax and lead to a bending of the bilayer 2 caused by the desired lattice mismatch between the SiGe layer 6 and the upper first Si layer 4.

Depending on the design of the bilayer 2, i.e. the thickness of the upper first Si layer 4 and the second lower SiGe 6 layer and the Ge concentration in the SiGe layer 6 and according the chosen lattice mismatch, the upper Si layer 4 will harbour tensile strain in a region 4b close to the Si/SiGe interface 5 and compressive strain in a region 4a at its surface. Thus a vertical channel for 2-dimensional electron gas is formed in the tensile strain within the vertical rings, confined by the compressive strained Si and the SiGe layer 4, 6 resp. The same holds for holes, here a vertical 2-d hole gas is formed in a compressive section 6a of the SiGe layer 6 close to the Si/SiGe interface 5 which is confined by a relaxed outer section 6a of the SiGe layer 6 and by the tensile strained Si. Thus this structure provides the bases for n- and p-type FETs.

Due to fact that the sidewalls of the rings 14, 16, 18 are epitaxially fabricated surfaces and interfaces of films deposited on the (100) Si substrate 10, they are perfectly smooth with a roughness only in the atomic range.

Figure 4:
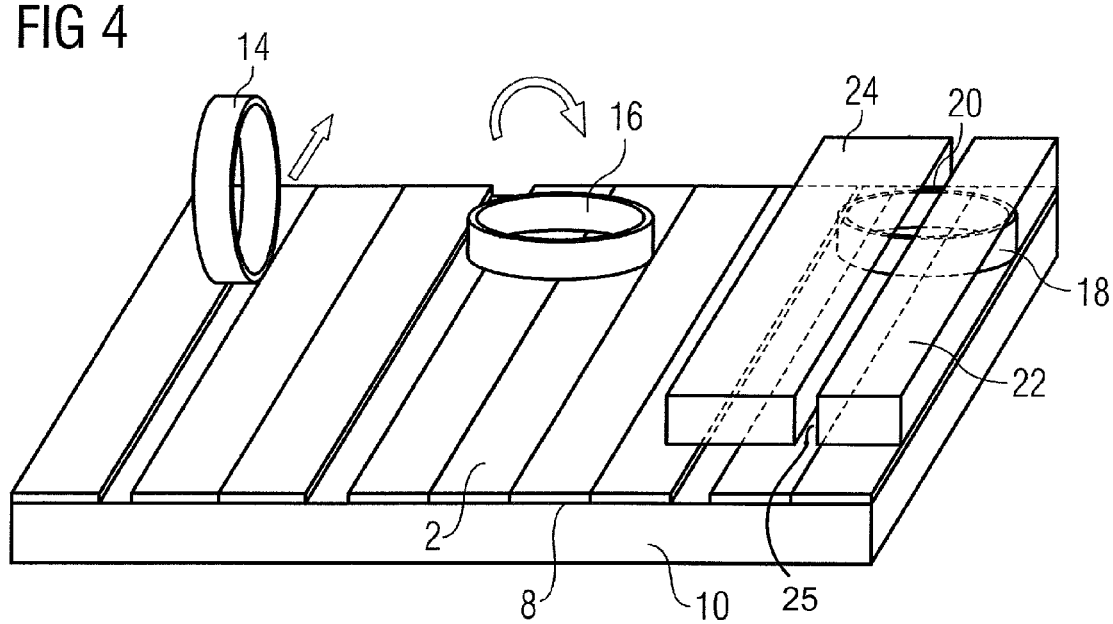
FIG. 4 is a schematical sketch of the fabrication of a Fin-FET structure using the surface as shown in FIG. 3.

In a fourth step as shown in FIG. 4 for the ring 18 as an example, the bilayer or second section 2 is shown as well as a gate region or fourth section 20 which is protected by an $SiO_2$ or $SiN_x$ layer and selective growth is used to deposit a source layer or first section 22 and a drain layer or third section 24 as schematically shown. The bilayer or second section 2 has a distinct part 25 aligned with the fourth section 20. These can be either in-situ doped or doped by implantation during the further fabrication process of the devices. The result is a structure similar to conventional structures used in the fabrication of Fin-FETs in consequently conventional CMOS processing steps can be used to fabricate the device. In the sketch a ring 18 is used to fabricate two devices, however, in principle it can be separated in many more segments. It also has to be pointed out that the selective epi process may offer some unique opportunities for a self aligned gate processing.

Figure 5:
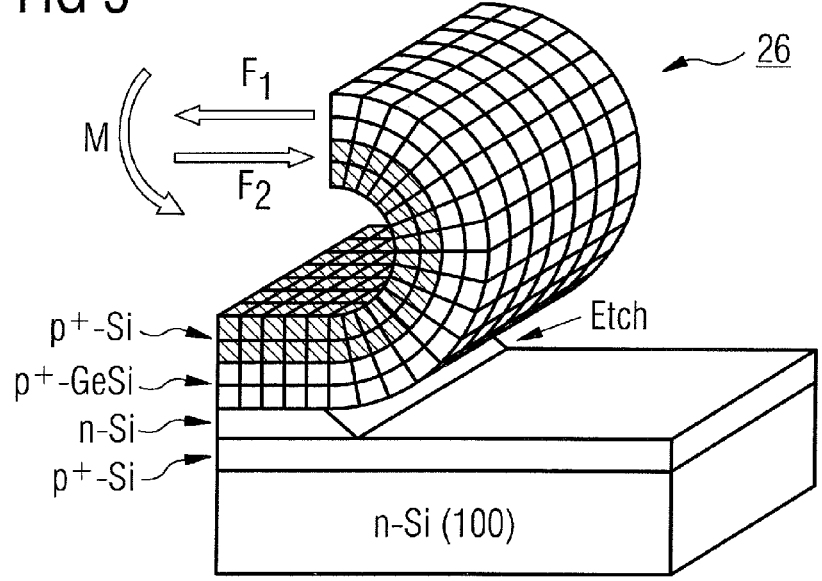
FIG. 5 is a second schematical sketch of the fabrication of a Fin-FET.
Figure 6:
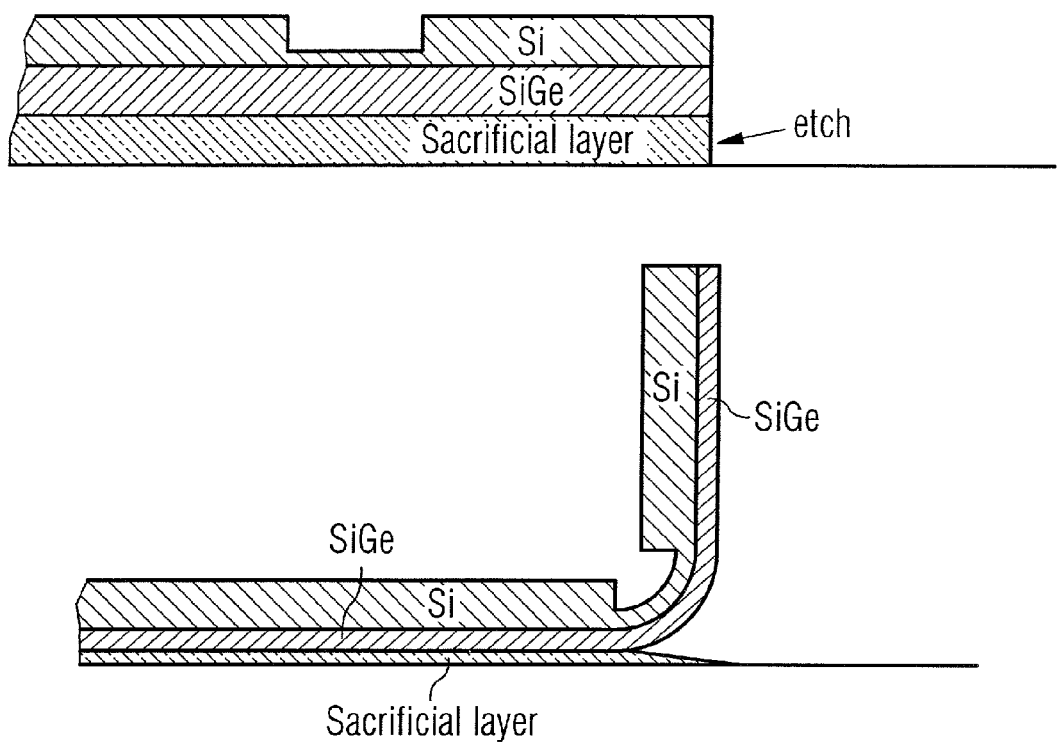
FIG. 6 is a third schematical sketch of the fabrication of a Fin-FET.

A second example is shown in FIG. 5, a simple square mesa structures is underetched, leading to vertical standing bilayer films 26. However, this approach will either lead to curved fins or tubes as illustrated in FIG. 5, which may lead to non-uniformities within the channel, or to a loss of the strained Si section if an approach like sketched in FIG. 6 is used. Referring to FIG. 5, a schematic representation of a tube formation technology is shown. Strain induced bending (caused by a smaller lattice constant of the upper $p^+$ Si layer in comparison to the lattice constant of the lower $p^+$ GeSi layer) of the GeSi/Si bilayer detached from the substrate in the course of a lateral undercut etching which leads to the self-scrolling of the bilayer during etching the sacrificial n-Si layer. The oppositely directed forces $F_1$ and $F_2$ give rise to a moment M, tending to bend the bilayer.

In the embodiment according to the FIGS. 1 to 4 the formation of vertical rings from the strained semiconductor heterostructure comprising a Si/SiGe bilayer is described. For this specific formation as well as for all other strained semiconductor heterostructures all material combinations will work, which fulfill the afore-mentioned requirements. To allow for scrolling the crucial requirement is that the net average lattice constant in the top part has to be smaller than the net average lattice constant of the bottom part. The strained heterostructure comprises substantially two sections, section I is in this example considered as the top part and section II is the bottom part respectively. Of course, each section can contain one or more layers of different composition.

In the case of pseudomorphic or only partly relaxed growth of section I and II this strain induced by the lattice mismatch will guarantee the scrolling process. Possible section I/section II material combinations can be found in group IV semiconductor heterostructures, such as i.e. $Si/Si_xGe_{1-x}$, $Si_yC_{1-y}/Si_xGe_{1-x}$. According to group III/V compound semiconductors suitable material combinations comprises combinations such as i.e. $GaAs_yP_{1-y}/Al_xGa_{1-x}As$, $Al_xGa_{1-x}As/Ga_zIn_{1-z}As_yP_{1-y}$, $Ga_xIn_{1-x}As_yP_{1-y}/Ga_xIn_{1-x}As_ySb_{1-y}$, $Ga_xIn_{1-x}As_yN_{1-y}/Al_zGa_{1-z}As$ and related materials. There exist as well as number of suitable group II/VI compound semiconductors, such as i.e. $ZnS_ySe_{1-y}/ZnSe_zTe_{1-z}$, $Cd_xHg_{1-x}S/Cd_yHg_{1-y}Te$ and related materials and IV/VI compound semiconductors, such i.e. $Pb_{1-x}S_ySe_{1-y}/Pb_{1-z}Sn_zTe$ $Pb_yMn_{1-y}Se/Pb_{1-x}Mn_xTe$, $Pb_{1-x-y}Sn_xGe_yTe/Pb_{1-z}Ge_zTe$ and related compounds.

The introduction of Ga or In atoms into IV/VI materials as well as of Mn or other doping atoms into III/V compounds or group IV heterostructures is possible as well.

Structures containing more than one layer in section I and II may contain the following structures: SiC/Si/SiGe or GaAs/GaInAsP/GaInAs/InP. These combinations will allow for complex band gap design permitting the confinement of two-dimensional electron and hole gases in the hetero- and quantum well structures.

Although, a number of preferred embodiment of this invention has been disclosed, a person of ordinary skill in this art would recognize that certain modifications and variations would come within the scope of this invention. For that reason, the following claims should be studied to determine the true scope and content of this invention.

What is claimed is:

1. An electro-mechanical component, comprising:
  a) a first, a second and a third section, the second section functionally connecting the first and the third sections;
  b) the second section being a bilayer having a first layer and a second layer made from two dissimilar at least semiconductive materials;
  c) the two materials having different lattice constants;
  d) the first layer having tensile strain close to an interface connecting the first and the second layer and having compressive strain at its surface;
  e) the second layer having compressive stain close to the interface connecting the first and the second layer and tensile strain at the relaxed outer section; and
  f) the second section being aligned in a distinct part with a fourth section, said distinct part being covered by an insulating layer, and the first and third sections being selectively grown on non-insulated parts of the second section.

2. The electro-mechanical component according to claim 1, wherein the second section is formed by applying a mesa structure to said bilayer and selectively underetching the mesa structure.

3. The electro-mechanical component according to claim 1, wherein the bilayer is disposed on a sacrificial layer of a semiconductor material.

4. The electro-mechanical component according to claim 3, wherein the sacrificial layer is deposited on top of a Si wafer or a SOI wafer.

5. The electro-mechanical component according to claim 1, wherein the first layer is over a partial section weakened with respect to its depth.

6. The electro-mechanical component according to claim 1, wherein the second section is a channel section between a drain and a source of a field effect transistor.

7. The electro-mechanical component according to claim 1, wherein the first layer is made of epitaxially grown Si and the second layer is made of epitaxially grown SiGe.

8. The electro-mechanical component according to claim 1, wherein, the bilayer including the first layer/second layer is chosen from a group IV semiconductor heterostructures containing $Si/Si_xGe_{1-x}$, $Si_yC_{1-y}/Si_xGe_{1-x}$.

9. The electro-mechanical component according to claim 1, wherein at least one of the first layer and the second layer sandwich include more than one sublayer, said sandwich including a SiC/Si/SiGe or GaAs/GaInAsP/GaInAs/InP structure.

10. The electro-mechanical component according to claim 1, wherein the second section is an inductive or capacitive part of an inductor or a capacitor respectively.

11. An electro-mechanical component, comprising:
  a) a first, a second and a third section, the second section functionally connecting the first and third sections;
  b) the second section being a bilayer having a first layer and a second layer made from two dissimilar at least semiconductive materials;
  c) the two materials having different lattice constants;
  d) the first layer having tensile strain close to an interface connecting the first and second layers and having compressive strain at its surface;
  e) the second layer having compressive stain close to the interface connecting the first and second layers and tensile strain at a relaxed outer section; and
  f) the second section being formed as a substantially cylindrical ring or as a part of a substantially cylindrical ring with at least one front end being partially coated with an insulating layer.

12. An electro-mechanical component, comprising:
  a) a first, a second and a third section, the second section functionally connecting the first and third sections;
  b) the second section being a bilayer having a first layer and a second layer made from two dissimilar at least semiconductive materials;
  c) the two materials having different lattice constants;
  d) the first layer having tensile strain close to an interface connecting the first and second layers and having compressive strain at its surface;
  e) the second layer having compressive stain close to the interface connecting the first and second layers and tensile strain at a relaxed outer section; and
  f) the first layer/second layer of the bilayer being chosen from a group III/V compound semiconductors containing $GaAs_yP_{1-y}/Al_xGa_{1-x}As$, $Al_xGa_{1-x}As/Ga_zIn_{1-z}As_yP_{1-y}$, $Ga_xIn_{1-x}As_yP_{1-y}/Ga_xIn_{1-x}As_ySb_{1-y}$, $Ga_xIn_{1-x}As_yN_{1-y}/Al_zGa_{1-z}As$.

13. An electro-mechanical component, comprising:
  a) a first, a second and a third section, the second section functionally connecting the first and third sections;
  b) the second section being a bilayer having a first layer and a second layer made from two dissimilar at least semiconductive materials;
  c) the two materials having different lattice constants;
  d) the first layer having tensile strain close to an interface connecting the first and second layers and having compressive strain at its surface;
  e) the second layer having compressive stain close to the interface connecting the first and second layers and tensile strain at a relaxed outer section; and
  f) the first layer/second layer of the bilayer being chosen from a group II/VI compound semiconductors containing $ZnS_ySe_{1-y}/ZnSe_zTe_{1-z}$, $Cd_xHg_{1-x}S/Cd_yHg_{1-y}Tc$ and related materials and/or a group IV/VI compound semiconductors containing $Pb_{1-x}Sn_xS_ySe_{1-y}/Pb_{1-z}Sn_zTePb_yMn_{1-y}Se/Pb_{1-x}Mn_xTe$, $Pb_{1-x-y}Sn_xGe_yTe/Pb_{1-z}Ge_zTe$.

14. An electro-mechanical component, comprising:
  a) a first, a second and a third section, the second section functionally connecting the first and third sections;
  b) the second section being a bilayer having a first layer and a second layer made from two dissimilar at least semiconductive materials;
  c) the two materials having different lattice constants;
  d) the first layer having tensile strain close to an interface connecting the first and second layers and having compressive strain at its surface;
  e) the second layer having compressive stain close to the interface connecting the first and second layers and tensile strain at a relaxed outer section; and
  f) an introduction of Ga or In atoms into IV/VI materials as well as of Mn or other doping atoms into III/V compounds or group IV heterostructures.

* * * * *